United States Patent [19]

Tam

[11] Patent Number: 5,045,832
[45] Date of Patent: Sep. 3, 1991

[54] DIGITALLY CONTROLLED VARIABLE RESISTOR

[75] Inventor: Ambrose W. C. Tam, Hong Lok Yuen Taipo, Hong Kong

[73] Assignee: Astec International Limited, Kowloon, Hong Kong

[21] Appl. No.: 457,333

[22] Filed: Dec. 27, 1989

[51] Int. Cl.$^5$ .......................................... H01C 13/00
[52] U.S. Cl. .................................... 338/334; 338/48; 338/306; 307/490; 323/354; 357/51
[58] Field of Search ................. 338/306, 307, 48, 334; 323/364, 365, 367, 352, 353, 354; 357/51; 364/482, 481; 307/490, 362, 304, 597, 603, 605

[56] References Cited

U.S. PATENT DOCUMENTS

| | | | |
|---|---|---|---|
| 3,947,701 | 3/1976 | Russell, Jr. | 307/264 |
| 4,016,483 | 4/1977 | Rudin | 323/354 |
| 4,644,193 | 2/1987 | Ott | 307/490 |
| 4,668,932 | 5/1987 | Drori et al. | 338/48 |
| 4,849,903 | 7/1989 | Fletcher et al. | 364/482 |

FOREIGN PATENT DOCUMENTS 0123222 10/1984 European Pat. Off. .
2385195 10/1978 France .
80/01632 7/1980 World Int. Prop. O. .

OTHER PUBLICATIONS

M. Satou et al., "A Volume and Tone Control IC for HiFi Audio", pp. 26, 27, 256. IEEE International Solid-State Circuits Conference, vol. 24, (1981).
R. Metz, "Combination Logic Cuts Parts in Digitally Controlled Amplifier" pp. 94, 95 Electronics, vol. 48, No. 19, (1975).
NASA TechBrief, "Electronically Controlled Resistor Bank," 2301 N.T.I.S. TechNotes (1988) Jan., Springfield, VA, U.S.A.
IBM Technical Disclosure Bulletin, "Compensating Non-Ideal Voltage Switches In Digital-to-Analog Converters (R/2R Conductors," vol. 28, No. 3, p. 1149, Aug. 1985.
Electronic Engineering, Oldrich Podzimek, "D/A Converter With $V=N^{-1}$ Conversion," 57 (1985) Jan. No. 697, London, Great-Britain.
IBM Technical Disclosure Bulletin, Bachman, B. E., "Binary Programmed Power Supply," vol. 9, No. 10, p. 1330, Mar. 1967.

Primary Examiner—Marvin M. Lateef
Attorney, Agent, or Firm—Arnold, White & Durkee

[57] ABSTRACT

A compact and inexpensive variable resistor circuit has a value of resistance that can be set by a data signal. The variable resistor includes a number of variable individual resistances connected in series, and an electronic switch connected in parallel across each individual resistance. The values of the individual resistances are chosen to include a basic resistance value and a compensating resistance value, which corresponds to the impedance of the associated electronic switch in its closed state. The basic value is chosen from the progression $2^0$, $2^1$, $2^2$, $2^3$, and so on, so that the resistance of the variable resistor corresponds to the binary value of data applied to control the electronic switches. Other aspects of the invention include input and control circuitry which is designed to minimize its size and allow it to be packaged on an integrated circuit.

20 Claims, 2 Drawing Sheets

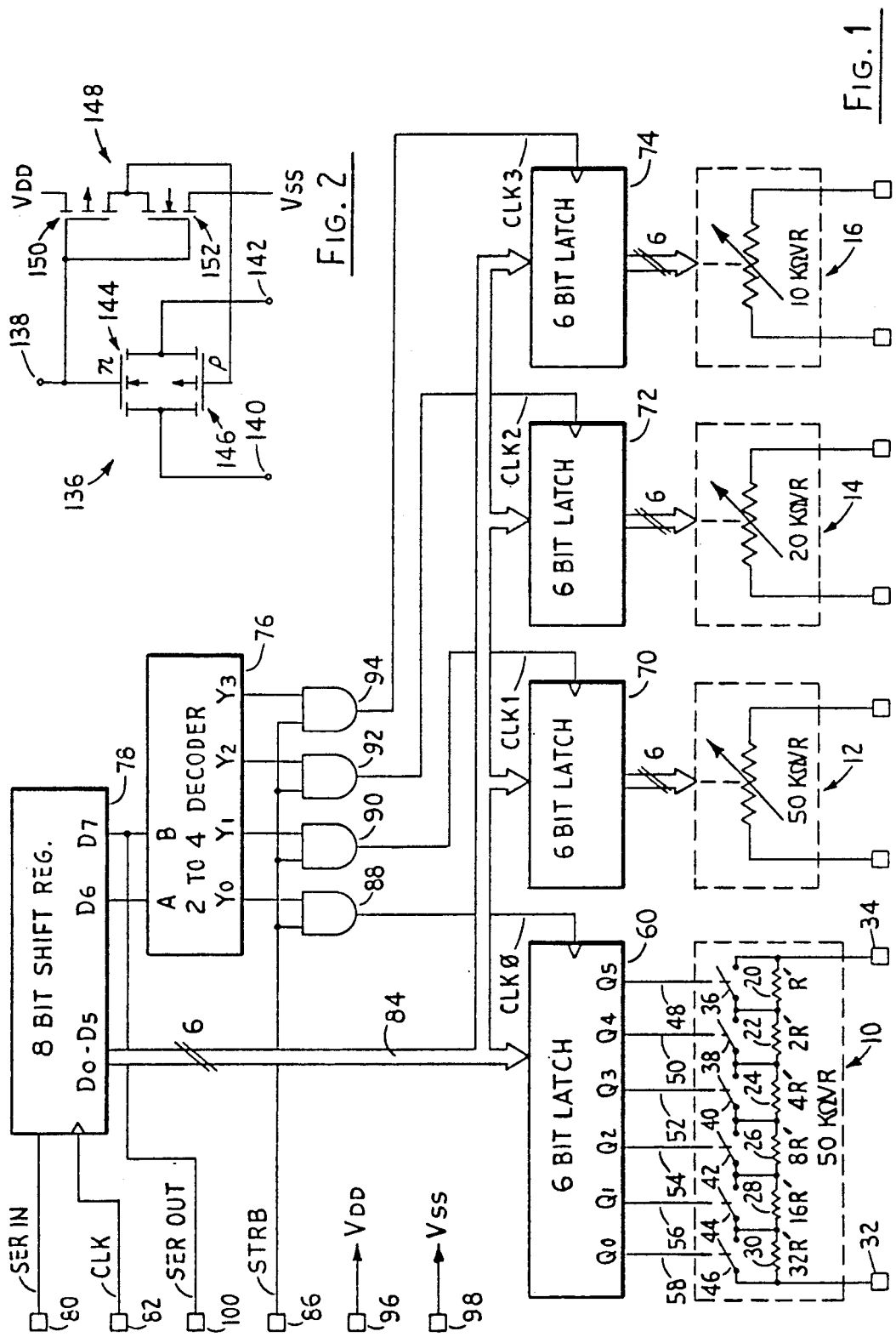

DIGITALLY CONTROLLED VARIABLE RESISTOR

TECHNICAL FIELD

This invention relates to variable resistors. In particular, the invention relates to a resistor device whose resistance value can be set according to a data signal and varied from time to time simply by changing the data signal.

BACKGROUND ART

Data-controlled variable resistors have been used in place of manually controlled potentiometers in applications, inter alia, requiring periodic or remotely actuated resistance adjustments. For example, one such variable resistor is sold under the name E²Pot by Xicor Corporation. The E²Pot device has a large number of resistors of different values arranged in parallel and an electronic wiper which becomes conductive with one of a large number of contacts, one of which is associated with each resistance, in order to place a selected one of the resistances in a circuit. Such an arrangement inevitably requires a large amount of space and is also relatively expensive, since a large number of resistors are required to cover a full range of resistances even though only one of the resistors is used at any given time.

Recently, there have been attempts to provide variable resistors which overcome some of the problems associated with the E²Pot device. In one such attempt, it has been suggested that a series of resistance circuits may be controlled such that the resistance circuits are combined to produce a large number of resistance values. Each of the circuits in the series includes a resistor having a resistance value that is equal to $2^n R$ (n being a different integer for each resistance circuit), and that is shunted by a power field-effect transistor (PFET). A particular resistance value for the series is selected by actuating selected ones of the PFETs to effectively short circuit the shunted resistors in the series. Unfortunately, due to the residual impedance of each PFET during its short circuit (or closed) state, selecting a particular resistance value from this prior art arrangement becomes extremely complex when the magnitude of that impedance is equal to or exceeds R.

SUMMARY OF THE INVENTION

A primary object of the present invention is to provide a more flexible, compact and inexpensive variable resistor whose value of resistance can be set by a data signal.

Another important object of the present invention is to provide a variable resistor circuit whose resistance may be easily and conveniently selected from a wide range of resistor values using a data signal to control a network of resistors.

In accordance with a preferred embodiment, the present invention provides a variable resistor device having a pair of terminals for providing a variable resistance to an external circuit. A plurality of individual resistances are connected in series between the pair of terminals, and an electronic switch is connected in parallel across each individual resistance, so that when a switch is closed the associated individual resistance is effectively shorted out from the series of individual resistances. Each individual resistance includes a basic resistance and a compensating resistance. The values of the basic resistances are chosen according to the desired range of the variable resistor. The compensating resistance is chosen to account for the residual impedance of the electronic switch. A digital latch, which responds to a binary data signal, includes outputs for controlling the switching of the electronic switches between their open and closed states, so that the value of resistance between the pair of terminals can be set by the data signal.

The values of the individual resistances are preferably chosen so that they proportionally follow the increasing binary progression $2^0, 2^1, 2^2, 2^3,$ and so on. The first basic resistance will have a value of say R, the second a value of 2R, the third a value of 4R and so on, the absolute value of R being any chosen FIGURE. In this way one can build up a variable resistance whose values can change stepwise by increments of R.

Because each of the electronic switches have a significant residual resistance when in their closed state, without somehow taking that resistance into account, the above binary progression will deteriorate once the value of the residual resistance reaches or exceeds the value of the individual resistance. For this reason, the compensating resistance is selected to correspond to the residual resistance of the associated electronic switch. When all the switches are closed, the variable resistor will have a certain minimum resistance of r, where r is approximately the sum of the internal resistances of the electronic switches. Preferably, the values of the individual resistances and the internal resistances of the switches are chosen so that the resistance of the variable resistor may be set to any value selected from the series $0+r, R+r, 2R+r, 3R+r$ and so on. This can be done by choosing the value of each resistor (e.g., R' of FIG. 1) to include a resistance of r/x in addition to the basic chosen value of the resistance R, where x is the total number of electronic switches. In other words, the first resistance should have a value of $R+r/x$, the second resistance should have a value of $2R+r/x$, the third resistance should have a value of $4R+r/x$, and so on. Also, the internal resistance of each switch (in parallel combination with its respective resistance) should provide a resistance of r/x when the switch is in its closed state. Thus, irrespective of whether an electronic switch is open or closed there will be included between the input and output terminals, a constant additional resistance value of r/x for each switch and resistance pair.

Also the choice of resistance values according to the above binary progression corresponds to the numerical value represented by the binary data signal so that say a data signal of 0000 can correspond to a resistance value of 0R, a signal of 0001 a resistance value of 1R, 0010 a resistance value of 2R, and so on.

The variable resistance device according to the invention is relatively inexpensive to make and relatively small in size in comparison with prior electronically variable resistors. Thus a wide range of resistance values can be achieved by combining the resistances and without having a large number of resistances only one of which is in use at any instant. Also the electronic switches can be simple and reliable and can conveniently be field effect transistors which again are relatively inexpensive, easy to make, small in size and reliable in comparison with electronic wiper switches used in prior variable resistances.

The variable resistance device according to the invention is formed of components which can readily be provided in a solid state integrated chip. Indeed, by way of example, we have found that up to 4 variable resistor devices according to the invention can easily be accommodated on a single normal size integrated chip, and each variable resistor device can therefore be small and inexpensive, e.g., one tenth of the cost of prior devices.

A further advantage of the invention is that the device does not need any RAM to store the data. Instead latch means are used to receive a data signal from time to time and once a data signal has been received the latch means will operate the switches as required and maintain that status until a new data signal is received. Moreover, shift register means and decoder means are provided to supply a selected latch means with data from a serial data stream. This permits the resistance of a selected variable resistor to be quickly adjusted by the transmission of data and control signals over a minimum number of connections to the integrated circuit.

BRIEF DESCRIPTION OF DRAWINGS

Other objects and advantages of the invention will become apparent upon reading the following detailed description and upon reference to the drawings, in which:

FIG. 1 is a functional block diagram of a variable resistor device according to the invention;

FIG. 2 is a schematic diagram of an electronic switch using complementary metal-oxide-semiconductor (CMOS) field-effect transistors.

Figure 3:
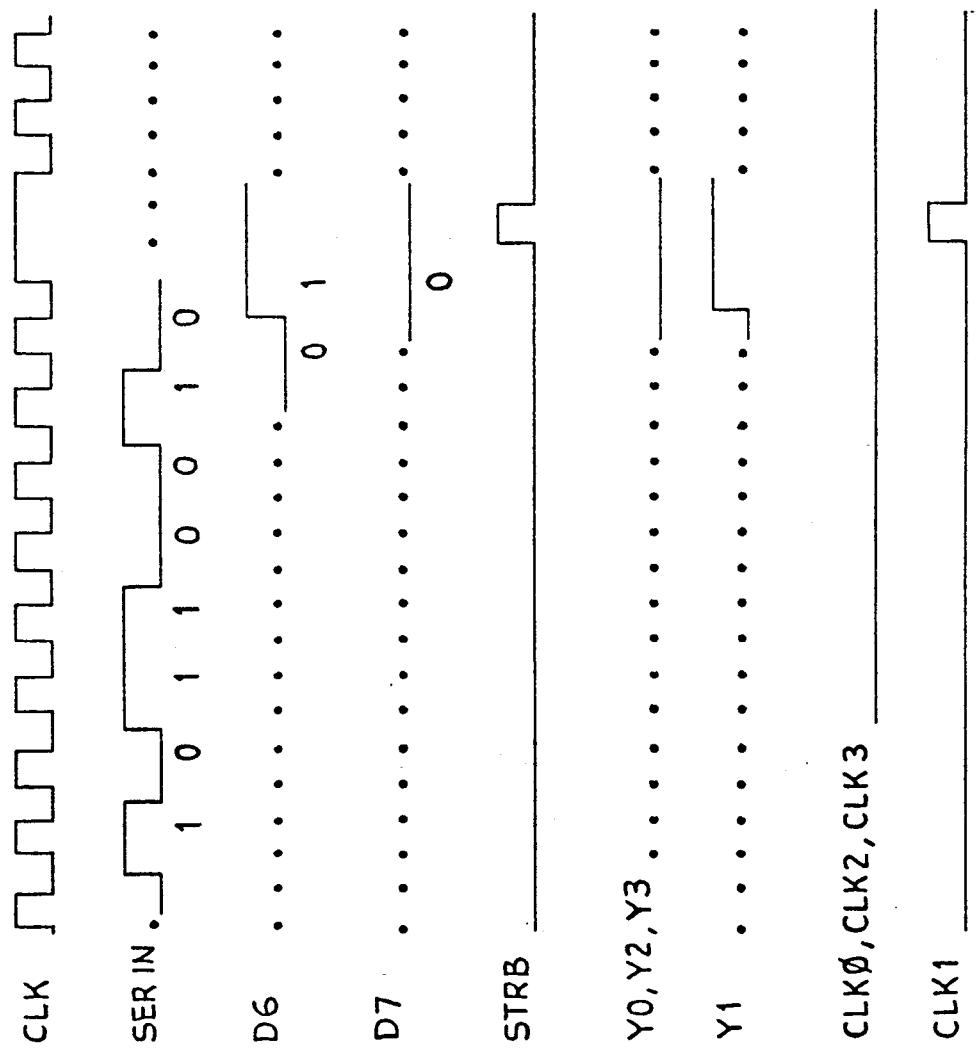
FIG. 3 is a timing diagram showing the sequence of data transmission to the variable resistor device of FIG. 1, and the decoding and latching of data within the device.

While the invention is susceptible to various modifications and alternative forms, a specific embodiment thereof has been shown by way of example in the drawings and will herein be described in detail. It should be understood, however, that it is not intended to limit the invention to the particular form disclosed, but on the contrary, the intention is to cover all modifications, equivalents, and alternatives falling within the spirit and scope of the invention as defined by the appended claims.

DESCRIPTION OF THE PREFERRED EMBODIMENT

Turning now to the drawings, there is shown in FIG. 1 a functional block diagram of a single integrated circuit including four variable resistor devices 10, 12, 14 and 16 according to the invention. Each variable resistor device 10 to 16 is basically the same and therefore only the device 10 will be described in detail.

The variable resistor device 10 is composed of six resistances 20 to 30 wired in series between an input terminal 32 and an output terminal 34. In parallel across each resistance 20 to 30 is a respective electronic analog switch 36 to 46. These switches are, for example, in the form of field effect transistors having an electrical conductivity varying from a low resistance in the closed circuit condition to a high resistance in the open circuit condition. They can be switched between the two conditions by a signal applied to their respective gates or control inputs 48 to 58.

One kind of well-known electronic switch suitable for use in the present invention is a complementary metal-oxide-semiconductor (CMOS) bilateral switch. The schematic diagram of such a switch 136 is shown in FIG. 2 for the purpose of illustrating the advantages and disadvantages of alternative constructions for the electronic switches used in the present invention. The CMOS bilateral switch 136 has a control input 138 and switch terminals 140 and 142. The CMOS bilateral switch 136 also has connections to power supply voltages $V_{DD}$ and $V_{SS}$. The supply voltage $V_{DD}$ is positive with respect to $V_{SS}$.

In order to provide an open or closed circuit between the switch terminals 140 and 142 in response to a logic signal on the control input 138, the switch 136 has a pair of insulated-gate field effect transistors 144 and 146 having their channels connected in parallel to the switch terminals 140 and 142, and having their gates coupled to the control input 138. The transistor 144 has an n-type channel rendered conductive when the voltage on its gate becomes substantially positive with respect to the voltages on the switch terminals 140, 142. The transistor 146 has a p-type channel rendered conductive when the voltage on its gate becomes substantially negative with respect to the voltages on the switch terminals 140, 142; so that the bilateral switch 136 is closed in response to a logic high of about $V_{DD}$ on the control input 138 and open in response to a logic low of about $V_{SS}$, the gate of the transistor 144 is connected directly to the control input 138, and the gate of the transistor 146 is connected indirectly to the control input 138 via a CMOS inverter stage 148. The CMOS inverter stage 148 includes an n-channel insulated-gate field-effect transistor 150 and a p-channel insulated-gate field-effect transistor 152.

It should be apparent that n-channel field-effect transistors or p-channel field-effect transistors, or both, can be used as electronic switches for the present invention. By using both p-channel and n-channel transistors in each electronic switch, the variable resistors can handle any analog signal within the range of the power supply, from $V_{SS}$ to $V_{DD}$.

Returning now to FIG. 1, it is seen that the electronic switches 36 to 46 are controlled according to data held in a 6-bit latch 60 having respective single-bit outputs connected to the gate inputs 48 to 58 of the switches. Therefore, the latch 60 may receive a data signal from time to time and once a data signal has been received the single-bit outputs of the latch 60 will open and close the switches as required and maintain that status until a new data signal is received.

The values of each resistance 20 to 30 are in the progression $2^0, 2^1, 2^2$, etc., so that their absolute values corresponding to R, 2R, 4R, etc. In this way by appropriately opening and closing the switches 36 to 46, the variable resistor can have a value which varies stepwise in units of R from 0 to 63R.

For each variable resistor device 10 to 16 its absolute value can be the same or different and is chosen according to the circuit which it is to control. For example, the resistor devices 10 and 12 are shown in the drawing as having a maximum resistance of 50 K ohms while resistor 14 has a maximum value of 20 K ohms and resistor 16 has a maximum value of 10 K ohms, all being variable in increments of approximately 1/64th of the maximum value.

In practice, the electronic switches 36 to 46 have a significant resistance when in their closed state. Therefore, when all of the switches are closed, the variable resistor 10 will have a certain minimum resistance of r, where r is approximately the sum of the internal resistances of the electronic switches. The values of the individual resistances 20 to 30 and the internal resistances of the switches are preferably chosen so that the resistance of the variable resistor can still be set stepwise in units of R to any value selected from the series $0+r$, $R+r$, $2R+r$, $3R+r$ and so on. This can be done by choosing the value of each resistor to include a compensating resistance of r/x in addition to the basic chosen value of the resistance R, where x is the total number of electronic switches; i.e., x is six for the variable resistor 10. In other words, the first individual resistance should have a value of $R+r/x$, the second individual resistance should have a value of $2R+r/x$, the third individual resistance should have a value of $4R+r/x$, and so on. Also, the internal resistance of each switch (in parallel combination with its respective individual resistance) should provide a resistance of r/x when the switch is in its closed state. Thus, irrespective of whether an electronic switch 36 to 46 is open or closed, between the input and output terminals 32 and 34, a constant additional resistance value of r/x will be included for each switch and resistance pair.

The choice of individual resistance values according to the above binary progression of R, 2R, 4R, etc., provides a direct correspondence between the numerical value represented by the binary data signal held in the latch 60 and the resistance of the variable resistor 10. For example, assuming that the single bit output $Q_0$ represents the "most significant bit" and the single bit output $Q_5$ represents the "least significant bit", then if the data were $000000_2$ representing a numerical value of 0, then all switches would be closed resulting in a resistance value of $0R+r$. If the data were $000001_2$ representing a numerical value of 1, then the switch 38 associated with the individual resistance 22 would be opened giving a value of $1R+r$. If the data were $001010_2$ representing a numerical value of 10, then the switches 38 and 42 associated with the individual resistances 22 and 26 would be opened giving a value of $10R+r$, and so on.

In the example shown in the drawing the variable resistor 10 includes six individual resistances 20 to 30. There could be more or less. Thus, if the latch 60 were to hold an 8-bit "byte," then the variable resistor 10 could have eight individual resistances in series, if the data were a 4-bit "nibble" then there could be four individual resistances, and so on.

As explained above, the integrated circuit of FIG. 1 includes four resistor devices 10 to 16 according to the invention. The device 10 has its own latch 60, while the other resistor devices have their own respective latches 70 to 74. It should be apparent that some means is required for setting or resetting the latches with data in such a way as to minimize the number of required connections to the integrated circuit. For this purpose, the latches could be connected in a shift register configuration so that data could be loaded into all of the latches over a single serial input as a clocking signal is applied to a clock input. Such a shift register configuration, however, would require all of the data in all of the latches to be changed to change the data for any one latch.

To supply data to a selected one of the latches, the integrated circuit of FIG. 1 includes a decoder 76 and a shift register 78. Data to be received in the selected latch is transmitted to the shift register 78 from a serial data terminal 80 as a clocking signal is applied to a clock terminal 82. The data appear on parallel outputs $D_0$ to $D_5$ of the shift register and are transmitted over a 6-bit data bus 84 connecting respective data inputs of the latches 60, 70, 72 and 74 in parallel. Only the selected one of the four latches, however, receives the data from the data bus 84, in response to a respective clock signal (CLK0, CLK1, CLK2, CLK3).

A particular one of the four latches 60 to 74 for receiving the six bits of data $D_0$ to $D_5$ is selected using two additional outputs $D_6$ and $D_7$ of the shift register. These outputs, which together indicate or address the selected register, are connected to a 2 to 4 decoder 76 providing four outputs Y0, Y1, Y2, Y3, so that only a selected one of the outputs is active at any given time. The output signals change, however, as data are shifted into the shift register 78. To indicate when the shift register 78 has received data for loading into a selected register, the integrated circuit has a terminal 86 for receiving a strobe signal (STRB). The strobe signal clocks the particular latch being addressed by the outputs $D_6$ and $D_7$ at the time that the strobe signal is applied. For this purpose, the respective clock signals (CLK0, CLK1, CLK2, CLK3) are obtained by gating the decoder outputs Y0, Y1, Y2, Y3 with the strobe signal (STRB) as indicated by respective AND gates 88, 90, 92, 94. Alternatively, the decoder 76 may be constructed to receive the strobe signal to gate the outputs Y0, Y1, Y2, Y3, as is done, for example, in conventional decoder integrated circuit part No. 74S139, which is described on page 2:46 of the *National Semiconductor TTL Data Book*, National Semiconductor Corporation, 2900 Semiconductor Drive, Santa Clara, Calif. 95051 (1976).

As introduced above, the integrated circuit of FIG. 1 may be formed on a single normal sized integrated circuit chip. In addition to the terminals discussed above, the integrated circuit chip has a power supply terminal 96, and a ground terminal 98. These terminals are shown supplying the voltages $V_{DD}$ and $V_{SS}$, which are fed to the logic components 60, 70, 72, 74 76, 78, 88, 90, 92, 94 and the electronic switches 36 to 46. In this case, it is assumed that these components use CMOS logic elements although alternatively the integrated circuit could use n-MOS or other kinds of logic elements.

The integrated circuit of FIG. 1 may fit in a standard integrated circuit package such as a 14-pin dual in-line package (DIP). As described above, 13 terminals are used to connection to the variable resistors, logic components, and power and ground for the integrated circuit. The 14th terminal 100 is conveniently used as an output for serial data (SER OUT) from the shift register 78. Therefore two or more integrated circuits similar to the integrated circuit of FIG. 1 are readily connected together, with the serial data input (80) of a second chip connected to the serial data output of a first chip, and the respective clock (82) and strobe (86) terminals of the two chips connected in parallel, to provide more than four variable resistors for an external circuit.

Specific examples of individual resistances which can be produced with particular input values of an 8 bit byte of data D0 to D7 are shown below in the following Table I, in which D0-D5 correspond to the individual resistances, e.g., 30-20 of FIG. 1, and D6-D7 are used to select one of the latches 60-74:

TABLE I

| DATA INPUT D0D1D2D3D4D5 | RESISTANCE VALUE (ohms) | RESISTANCE D6D7 = 00 RES 10 | = 10 RES 12 | = 01 RES 14 | = 11 RES 16 |
|---|---|---|---|---|---|
| 0 0 0 0 0 0 | 0R | 3 k | 3 k | 3 k | 3 k |
| 0 0 0 0 0 1 | R | 47/63 +3 k = 3.75 k | 47/63 +3 k = 3.75 k | 17/63 +3 k = 3.27 k | 7/63 +3 k = 3.11 k |
| 0 0 0 0 1 0 | 2R | 2(47/63) +3 k = 4.50 k | 2(47/63) +3 k = 4.50 k | 2(17/63) +3 k = 3.54 k | 2(7/63) +3 k = 3.22 k |
| 1 1 1 1 1 1 | 63R | 50 k | 50 k | 20 k | 10 k |

TABLE 1 demonstrates that selecting the individual resistances to compensate for the residual resistance (3k/6) of the electronic switches, when in their closed state, provide an increasing binary progression, even when that residual resistance is greater than R.

Turning now to FIG. 3, there is shown a timing diagram for the case where the data are 01001101 10. Irrelevant portions of the signals are shown as a string of periods ( . . . ). The data are supplied to the serial input terminal (80 in FIG. 1) and loaded into the shift register (78 in FIG. 1) by applying the clock signal (CLK) to the clock terminal (82 in FIG. 1). After eight clock cycles, the data are properly aligned in the shift register for loading into the selected latch (70 in FIG. 1). At this time the address for the selected latch appears on the outputs $D_6$ and $D_7$ of the shift register, and the strobe is applied on the strobe terminal 86 to clock the selected latch (70 in FIG. 1). Only the decoder output Y is a logic high when the strobe is applied. Therefore, only the CLK0 signal is active, and the data $D_0$ to $D_5$ is received only in the selected latch (70 in FIG. 1).

In view of the above, there has been described a compact and inexpensive variable resistor whose value of resistance can be set by a data signal. To reduce the size of the variable resistor, the variable resistor includes a number of variable resistances connected in series, and an electronic switch connected in parallel across each individual resistance. The values of the individual resistances are preferably chosen from the progression $2^0, 2^1, 2^2, 2^3,$ and so on, so that the resistance of the variable resistor corresponds to the binary value of data applied to control the electronic switches. At least four such variable resistances can be constructed on a single normal size integrated circuit chip. The integrated circuit includes a latch to hold the data signal until a new data signal is received. To minimize the number of connections to the chip, the integrated circuit further includes a shift register and a decoder to supply a selected latch with data from a serial data stream.

What is claimed is
1. A variable resistor, comprising:
  a pair of terminals for providing a variable resistance to an external circuit;
  a plurality of individual resistances connected in series between the pair of terminals, each individual resistance including a compensating resistance and a basic resistance;
  a plurality of electronic switches, each electronic switch being connected in a parallel with an associated one of the individual resistances, wherein each of the electronic switches, when in a closed state, exhibits a significant resistance, corresponding to the compensating resistance, and effectively shorts out the associated individual resistance; and
  latch means capable of receiving and holding a data signal and having outputs controlling the switching of the electronic switches between open and closed states, so that the value of resistance between the pair of terminals can be set by the data signal.

2. A variable resistor, according to claim 1, wherein the latch means holds a binary number and the outputs provide respective bits of the binary number, the value of each bit determining whether a respective one of the electronic switches is in an open or closed state.

3. A variable resistor, according to claim 1, wherein the basic values of the individual resistances proportionally follow the progression $2^0, 2^1, 2^2, 2^3,$ and so on.

4. A variable resistor, according to claim 1, wherein the compensating resistance is r/x, where the respective individual resistance values follow the progression $2^0+r, 2^1+r, 2^2+r, 2^3+r,$ and so on, where r is the minimum resistance between the terminals occurring when all of the switches are the closed state, and where x is the number of the individual resistances 5. A variable resistor, according to claim 1, wherein the electronic switches include field-effect transistors.

6. A variable resistor, according to claim 1, wherein the individual resistances, the electronic switches and the latch means are formed in a solid state integrated circuit chip.

7. A variable resistor, according to claim 1, further comprising a shift register having a serial data input for receiving the data signal, and a set of parallel outputs connected to the latch means.

8. An electronic circuit, comprising:
  a plurality of resistance networks, each network for providing a variable resistance between an associated pair of terminals;
  a plurality of switches, coupled to the resistor network, for changing the variable resistances;
  a plurality of latches for controlling the plurality of switches, each latch including a data input, a data output and an enable input for enabling data to be transferred from the data input and held on the data output;
  a shift register having a serial data input, a first parallel data output connected to a data bus, and a second parallel data output, the data bus connected in parallel to the data input of the latches; and
  a decoder having an input coupled to the second parallel data output and outputs coupled to respective enable inputs of the latches, so that a selected latch is enabled to receive data from the data bus as selected by data from the second outputs of the shift register;
  wherein the electronic switches are controlled by the data output of the latch so that the resistance between each pair of terminals is set in accordance with the data held on the outputs of the latch.

9. An electronic circuit, according to claim 8, wherein each network includes a series of individual resistances, and each of the individual resistance is arranged in parallel with one of the electronic switches, whereby when a switch is closed that individual resistance is shorted out from the series of individual resistances.

10. An electronic circuit, according to claim 9, wherein each electronic switch includes a significant resistance when it is in a closed state, and each individual resistance includes a basic resistance and a compensating resistance that corresponds to the significant resistance of the electronic switch, such that compensating resistance will be included for each individual resistance and associated electronic switch, irrespective of whether the electronic switch is in a closed state.

11. An electronic circuit, according to claim 8, wherein each latch holds a binary number and the data output of the latch includes a plurality of single-bit outputs providing respective bits of the binary number, the value of each bit determining whether a respective one of the electronic switches is in an open or closed state.

12. An electronic circuit, according to claim 9, wherein the values of the individual resistances in at least one of the networks proportionally follow the progression $2^0, 2^1, 2^2, 2^3,$ and so on.

13. An electronic circuit, according to claim 8, wherein the electronic switches and the latches are formed in a solid state integrated circuit chip.

14. An integrated circuit formed in a semiconductor chip, the integrated circuit comprising:
 a plurality of latches, each of the latches including a data input, a data output, and an enable input for enabling data to be transferred from the data input and held on the data output;
 a shift register having a serial data input, a first parallel data output connected to a data bus, and a second parallel data output coupled to the enable inputs of the latches, the data bus connecting in parallel with the data inputs of the latches; and
 for each latch, a respective pair of terminals for providing a variable resistance to an external circuit, a plurality of individual resistances and a plurality of associated electronic switches connected in series between the pair of terminals, wherein each individual resistance includes a basic resistance and a compensating resistance and is connected in parallel to one of the associated electronic switches whereby when a switch is closed that individual resistance is shorted out from the series of individual resistances, wherein the data output of the latch includes single-bit outputs controlling the switching of the electronic switches between open and closed states, so that the value of resistance between the pair of terminals can be set by the data signal held on the data output of the latch.

15. An integrated circuit, according to claim 14, wherein each latch holds a binary number and the single-bit outputs provide respective bits of the binary number, the value of each bit determining whether a respective one of the electronic switches is in an open or closed state.

16. An integrated circuit, according to claim 14, wherein the values of the basic resistances proportionally follow the progression $2^0, 2^1, 2^2, 2^3,$ and so on.

17. An integrated circuit, according to claim 14, wherein the compensating resistance will be included for each individual resistance and associated electronic switch, irrespective of whether the electronic switch is in a closed state.

18. An integrated circuit, according to claim 14, wherein the electronic switches, when in their closed state, have a significant resistance which corresponds to the compensating resistance which has a value of $r/x$, where the respective basic values follow the progression $2^0, 2^1, 2^2, 2^3,$ and so on, where r is the minimum resistance between the terminals occurring when all of the switches are closed, and where x is the number of the individual resistances.

19. An integrated circuit, according to claim 14, wherein the electronic switches include field-effect transistors.

20. An integrated circuit, according to claim 14, further comprising a decoder having an input connected to the second parallel data output, and outputs coupled to respective enable inputs of the latches, so that only a selected latch is enabled to receive data from the data bus as selected by data from the second output of the shift register.

* * * * *